US012757718B2

(12) United States Patent
Li et al.

(10) Patent No.: US 12,757,718 B2
(45) Date of Patent: Oct. 6, 2026

(54) POWER GATING TRANSISTOR FOR BSPDN

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 18/062,031

(22) Filed: Dec. 6, 2022

(65) Prior Publication Data

US 2024/0186246 A1 Jun. 6, 2024

(51) Int. Cl.

| | |
|---|---|
| ***H10W 20/41*** | (2026.01) |
| ***H10D 30/67*** | (2025.01) |
| ***H10D 62/10*** | (2025.01) |
| ***H10D 64/23*** | (2025.01) |
| ***H10D 84/83*** | (2025.01) |

(52) U.S. Cl.

CPC ........ *H10W 20/427* (2026.01); *H10D 64/251* (2025.01); *H10D 84/83* (2025.01); *H10D 30/6735* (2025.01); *H10D 62/121* (2025.01)

(58) Field of Classification Search

CPC .... H10W 20/427; H10D 64/251; H10D 84/83

See application file for complete search history.

(56) References Cited

U.S. PATENT DOCUMENTS 9,870,979 B2 1/2018 Batra
10,950,546 B1 * 3/2021 Doornbos .......... H10D 84/0186
11,004,789 B2 5/2021 Doornbos
11,257,764 B2 2/2022 Hiblot
11,322,197 B1 5/2022 Sisodia
12,057,371 B2 8/2024 Xie et al.
2019/0305773 A1 10/2019 Olsen
2020/0373242 A1 11/2020 Hiblot
2022/0068813 A1 3/2022 Chen
2022/0123751 A1 4/2022 Thyagarajan
2022/0139911 A1 5/2022 Wei
2024/0079476 A1 3/2024 Li et al.
2024/0224492 A1 * 7/2024 Okamoto ............... H10B 10/18
2024/0258236 A1 * 8/2024 Takeno .................. H10B 10/00

OTHER PUBLICATIONS

Lin et al., "Efficient Backside Power Delivery for High-Performance Computing Systems", IEEE Transactions on Very Large Scale Integration (VLSI) Systems, 2022, 9 pages.

* cited by examiner

*Primary Examiner* — Erik Kielin
(74) *Attorney, Agent, or Firm* — Samuel A. Waldbaum

(57) ABSTRACT

A microelectronic architecture including a logic device and a header gate transistor located adjacent to a first side of the logic device. The header gate transistor has a parallel orientation to the logic device, and the header gate transistor is connected to a VSS source or a VDD source. Aa footer gate transistor located adjacent to a second side of the logic device and the footer gate transistor has parallel orientation to the logic device. The first side and the second side are opposite sides of the logic device and the footer gate transistor is connected to a VSS source or a VDD source. The footer gate transistor is connected to a different source than the header gate transistor and the logic device is connected to the VSS source and the VDD source through either footer gate transistor and the header gate transistor.

20 Claims, 9 Drawing Sheets

CROSS-SECTION X

FIG. 3A CROSS- SECTION Y1
FIG. 3B CROSS- SECTION Y1
FIG. 3C CROSS- SECTION Y1

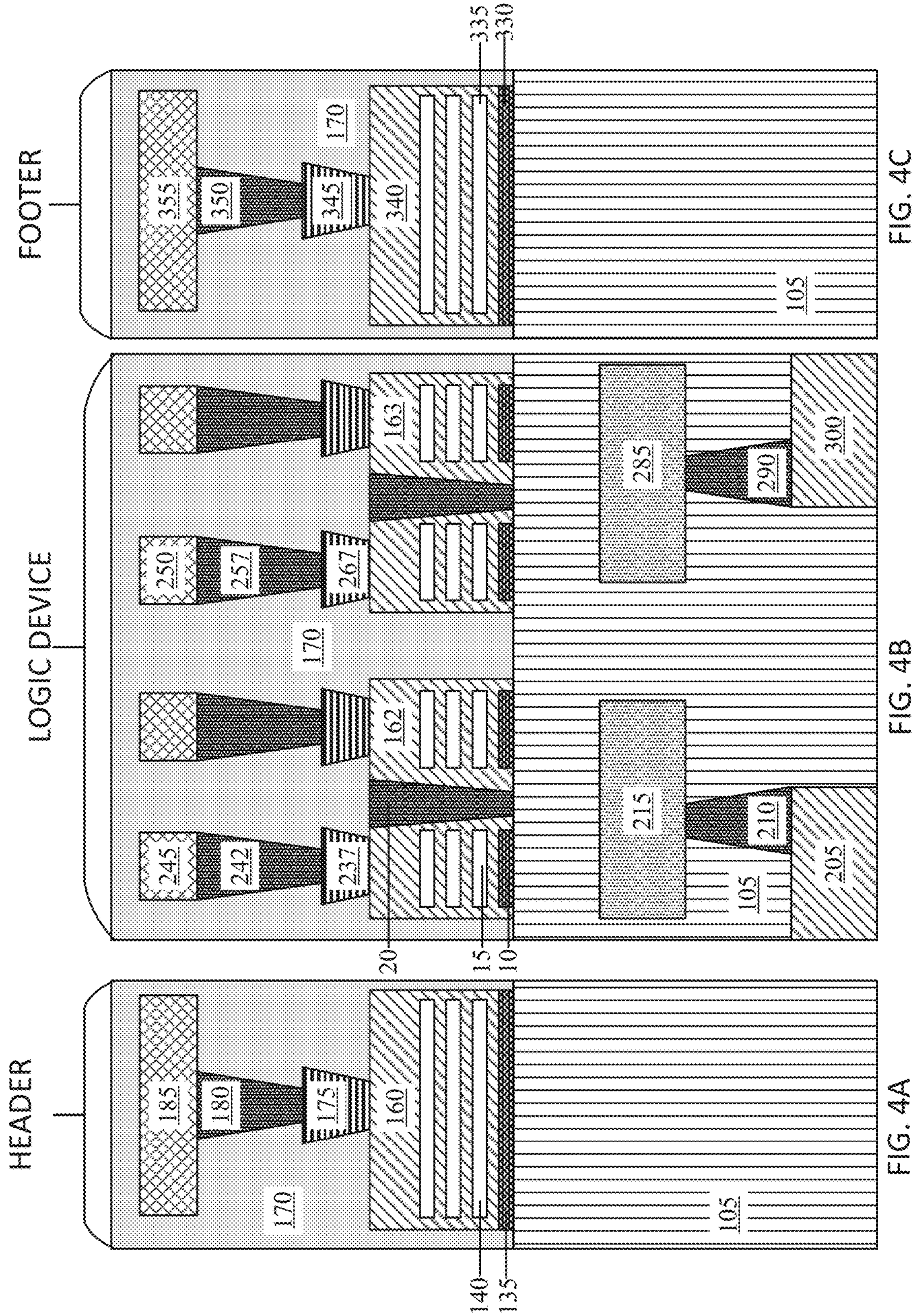
FIG. 4A CROSS- SECTION Y2
FIG. 4B CROSS- SECTION Y2
FIG. 4C CROSS- SECTION Y2

CROSS- SECTION Y3

CROSS- SECTION Y3

CROSS- SECTION Y3

CROSS- SECTION X

CROSS- SECTION Y1

CROSS- SECTION Y1

CROSS- SECTION Y1

CROSS- SECTION Y2

CROSS- SECTION Y2

CROSS- SECTION Y2

CROSS- SECTION Y3

CROSS- SECTION Y3

CROSS- SECTION Y3

POWER GATING TRANSISTOR FOR BSPDN

BACKGROUND

The present invention generally relates to the field of microelectronics, and more particularly to utilizing power gating transistor with a backside-power-distribution-network.

Nanosheet is the lead device architecture in continuing CMOS scaling. However, nanosheet technology has shown issues with leakage in the standby mode. An economical process for controlling the leakage of a logic device when the logic device is utilizing a backside-power-distribution-network has not been designed.

BRIEF SUMMARY

Additional aspects and/or advantages will be set forth in part in the description which follows and, in part, will be apparent from the description, or may be learned by practice of the invention.

A microelectronic architecture including a logic device and a header gate transistor located adjacent to a first side of the logic device. The header gate transistor has a parallel orientation to the logic device, and the header gate transistor is connected to a VSS source or a VDD source. A footer gate transistor located adjacent to a second side of the logic device and the footer gate transistor has parallel orientation to the logic device. The first side and the second side are opposite sides of the logic device and the footer gate transistor is connected to a VSS source or a VDD source. The footer gate transistor is connected to a different source than the header gate transistor and the logic device is connected to the VSS source and the VDD source through either footer gate transistor and the header gate transistor.

A microelectronic architecture including a logic device a header gate transistor located adjacent to a first side of the logic device. The header gate transistor has a parallel orientation to the logic device and the header gate transistor is connected to a VSS source or a VDD source. The VSS source or the VDD source is connected to the frontside of the header gate transistor. A footer gate transistor located adjacent to a second side of the logic device and the footer gate transistor has parallel orientation to the logic device. The first side and the second side are opposite sides of the logic device and the footer gate transistor is connected to a VSS source or a VDD source. The footer gate transistor is connected to a different source than the header gate transistor and the logic device is connected to the VSS source and the VDD source through either footer gate transistor and the header gate transistor. The VSS source or the VDD source is connected to the frontside of the footer gate transistor.

A microelectronic architecture including a logic device and a header gate transistor and a footer gate transistor located a side of the logic device, respectively. The backside of the header gate transistor and the backside of the footer gate transistor is each connected to either a VSS source or a VDD source. The backside of the logic device is connected to the VSS source and the VDD source through either footer gate transistor and the header gate transistor.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIGS. 3A to 3C illustrate cross section Y1 of a first source/drain region across the header gate transistor, the logic device, and the foot gate transistor, in accordance with the embodiment of the present invention.

FIGS. 4A to 4C illustrate cross section Y2 of a gate region across the header gate transistor, the logic device, and the foot gate transistor, in accordance with the embodiment of the present invention.

DETAILED DESCRIPTION

Figure 1:
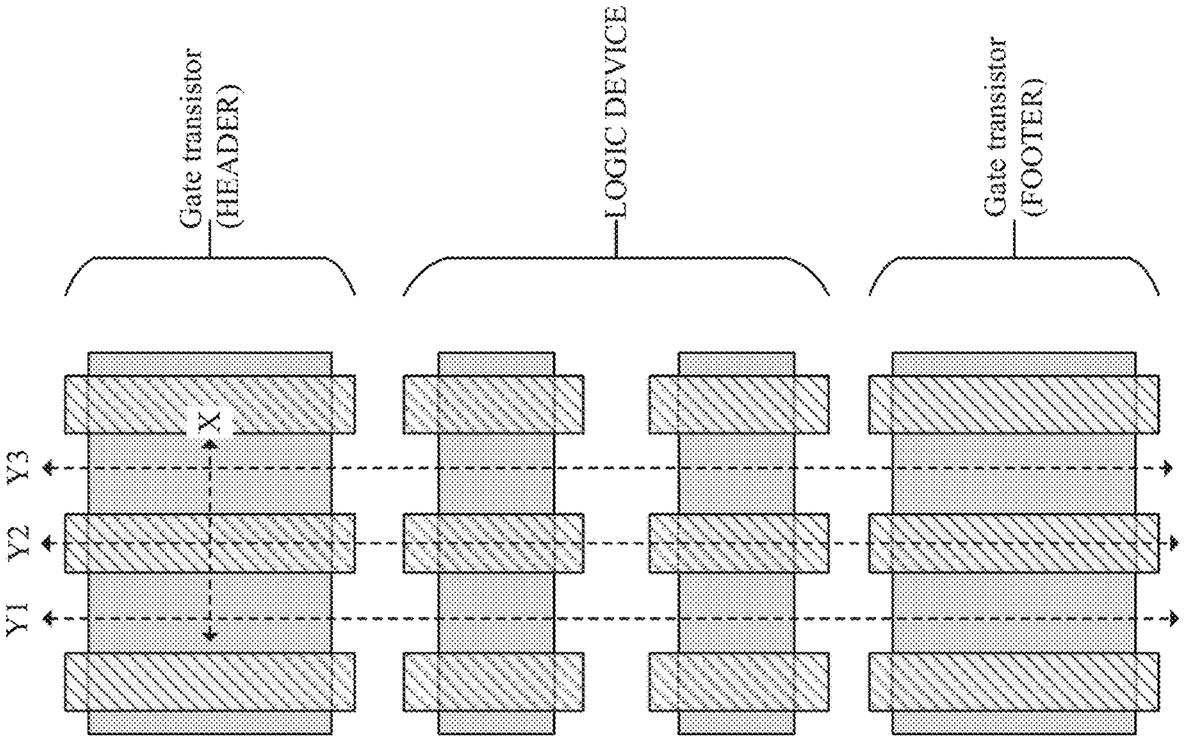
FIG. 1 illustrates a top-down view of a logic device, a header gate transistor, and a footer gate transistor, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards a design architecture that utilizes a gate transistor to control the power to a backside-power-distribution-network (BSPDN) to control leakage from the logic devices connected to the BSPDN. Power gating transistors disconnect logic cells from the supply and/or ground to reduce the leakage in the standby mode. More precisely, utilizing gate transistors as footer and/or header switches to disconnect ground and/or power from parts of a design in the circuit standby mode to prevent leakage. The gate transistors, i.e., a header gate transistor and a footer gate transistor, are in parallel to the logic cell. The header and footer gating transistor are formed simultaneously with the logic device/cell.

FIG. 1 illustrates a top-down view of multiple devices, in accordance with the embodiment of the present invention. The cross-section X extends horizontally through the header gate transistor. Cross section $Y_1$ is perpendicular to cross section X, where cross section $Y_1$ is through a first source/drain region that spans across the header gate transistor, the logic device, and footer gate transistor. Cross section $Y_2$ is perpendicular to cross section X, where cross section $Y_2$ is through the gate region that spans across the header gate transistor, the logic device, and footer gate transistor. Cross section $Y_3$ is perpendicular to cross section X, where cross section $Y_3$ is through a second source/drain region that spans across the header gate transistor, the logic device, and footer gate transistor.

Figure 2:
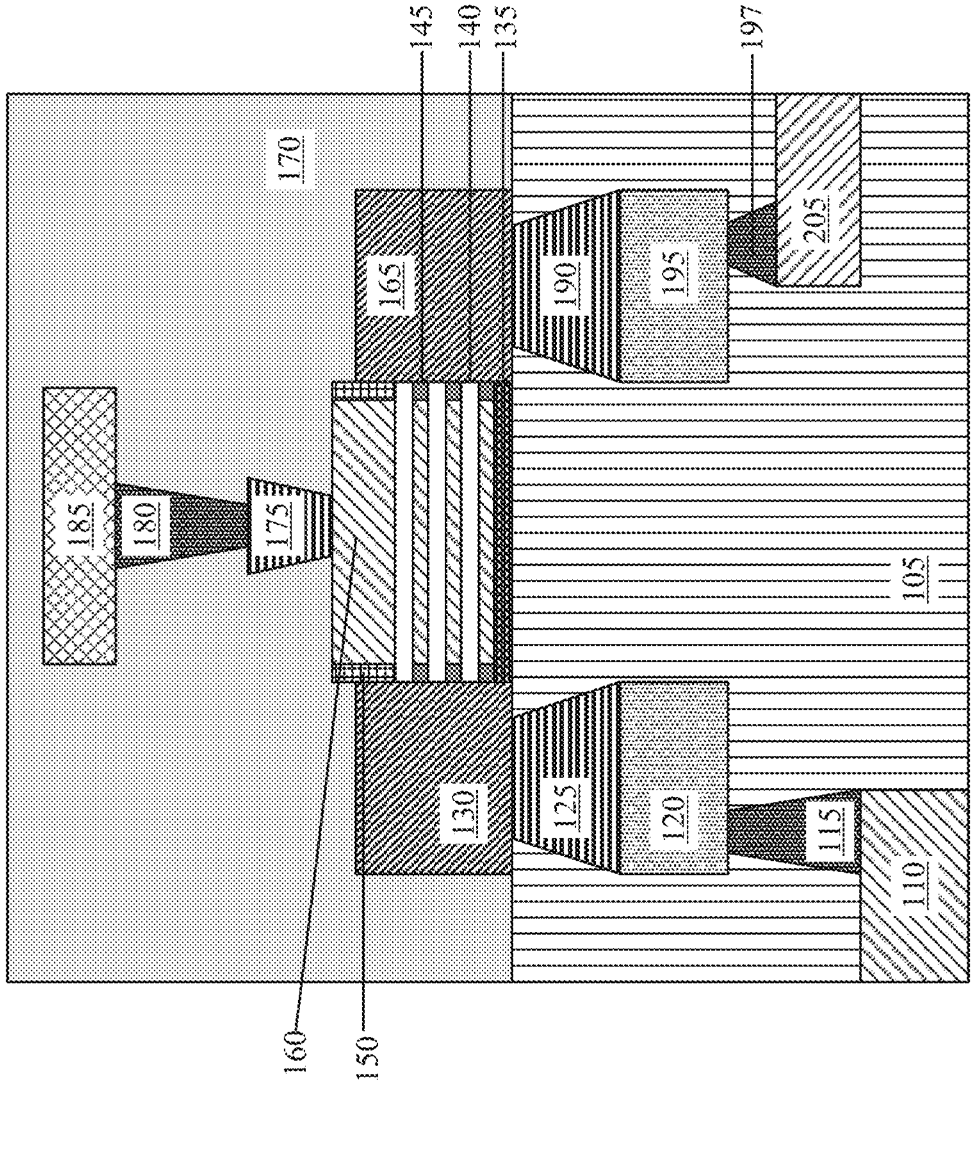
FIG. 2 illustrates a cross section X of header gate transistor, in accordance with the embodiment of the present invention.

FIG. 2 illustrates a cross section through the header gate transistor. The header gate transistor includes a backside interlayer dielectric layer 105 that is located around the backside components and a frontside interlayer dielectric layer 170 located around the frontside components. The frontside components includes a first source/drain 130, a second source/drain 165, a gate and channel region, a header gate contact 175, a frontside via 180, and a frontside metal line 185. The backside components include a first backside power line 110, a first backside via 115, a first backside power rail 120, a first backside contact 125, a second backside contact 190, a second backside power rail 195, a second backside via 197, and a first backside connecting power line 205.

The gate and channel region includes a bottom dielectric layer 135, a plurality of channel layers 140, an inner spacer 145, an upper spacer 150, and a gate 160. The gate 160 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. The header gate contact 175 is in contact with a top surface of the gate 160. The frontside metal line 185 is connected to the header gate contact 175 by a frontside via 180. The first source/drain 130 is located adjacent to a first side of the gate region and the second source/drain 165 is located adjacent to a second side of the gate region, where the first side and the second side are opposite to each other. The first source/drain 130 and the second source/drain 165 are located flush against the side of the channel layers 140 and the inner spacer 145.

The first source/drain 130 and the second source/drain 165 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIG. 2 also illustrates that the backside power line 110 is located on a first metal line level and that the first backside connecting power line 205 is located on a second metal line level. FIG. 2 illustrates that the first backside connecting power line 205 is located on a higher level than the backside power line 110. The location of the backside power line 110 and that the first backside connecting power line 205 as illustrate is meant for illustrative purposes only and not meant to limiting. For example, the first backside connecting power line 205 can be located at a lower metal line than the backside power line 110, or they can be at the same level.

FIGS. 3A to 3C illustrates a cross section of across the first source/drain region, where the cross section extends through the header gate transistor, the logic device, and the footer gate transistor. FIG. 3A shows a cross section across the header gate transistor (hereinafter, referred to as header). FIG. 3B shows the cross section across the logic device, and FIG. 3C shows the cross section across the footer gate transistor (hereinafter, refer to as footer).

As FIGS. 3A to 3C the frontside interlayer dielectric layer 170 and the backside interlayer dielectric layer 105 are located in the header, the logic device, and the footer. A first backside via 115 connects the backside power line 110 to a backside surface of the first backside power rail 120. A backside contact 125 is connected to the first backside power rail 120 and a backside surface of the first source/drain 130. The outside power/ground is connected to the header via the first backside power line 110, for example, the first backside power line 110 can be either a VSS or VDD source. The power/ground is directly connected to the header or footer, so that the header/footer acts as an intermediary power component between the outside power/ground and the logic device.

The footer illustrated in FIG. 3C has a similar structure as the header illustrated in FIG. 3A. The footer includes a third backside power line 305, a third backside via 310, a third backside power rail 315, a third backside contact 320, and a first footer source/drain 325.

FIG. 3B illustrates a cross section of the logic device through the first source/drain region. The logic device includes the first backside connecting power line 205, a first logic connecting via 210, a first logic backside power rail 215, a first logic backside contact 220, a first placeholder 225, a first logic source/drain 230, and a second logic source/drain 241. The logic device further includes a first frontside source/drain contact 235, a first frontside via 240, a first logic frontside metal line 245. The logic device includes a second frontside metal line 250, a second frontside source/drain contact 260, a second frontside via 255, a third logic source/drain 265, and a fourth logic source/drain 270. Additional backside components include a second placeholder 275, a second logic backside contact 280, a second logic backside power rail 285, a second logic connecting via 290, and a second backside power line 300 (also referred to as the second backside power connecting line). The first backside power line 205 is connected to the header and the second backside power line 300 is connected to the footer.

The first footer source/drain 325, the first logic source/drain 230, the second logic source/drain 241, the third logic source/drain 365, and the fourth logic source/drain 270 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIGS. 4A to 4C illustrates a cross section of across the gate region, where the cross section extends through the header gate transistor, the logic device, and the footer gate transistor. As illustrated by FIG. 4A, the gate region of the header includes the bottom dielectric layer 135, the channel layers 140, the gate 160, the header gate contact 175, the frontside via 180, and the frontside metal line 185. FIG. 4C illustrates the footer, where the footer includes a footer bottom dielectric layer 330, the footer channel layers 335, the footer gate 340, the footer gate contact 345, the footer frontside via 350, and the frontside footer metal line 355.

FIG. 4B illustrates the logic device that where the backside of the logic device includes the first backside power connecting line 205, the first logic connecting via 210, the first logic backside power rail 215, the second logic backside power rail 285, the second logic connecting via 290, and the second backside power line 300. The frontside of the logic device includes a logic bottom dielectric layer 10, a plurality of logic channel layers 15, a first logic gate 162, a logic gate cut 20, a first logic gate contact 237, a first logic gate via 242, the first logic frontside metal line 245, a second logic frontside metal line 250, a second logic gate via 257, a second logic gate contact 267, and a second logic gate 163. The first logic gate 162, the second logic gate 163, the header gate 160 and the footer gate 340 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W.

Figure 5A:
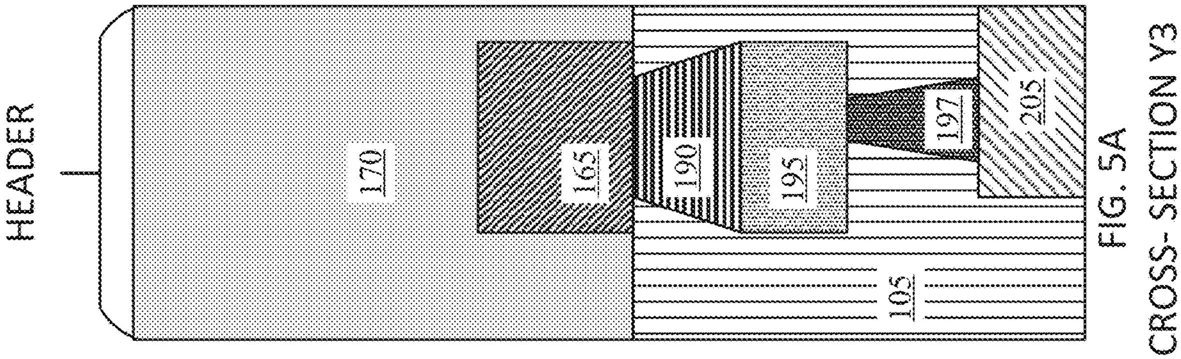
FIGS. 5A to 5C illustrate cross section Y3 of a second source/drain region across the header gate transistor, the logic device, and the foot gate transistor, in accordance with the embodiment of the present invention.
Figure 5B:
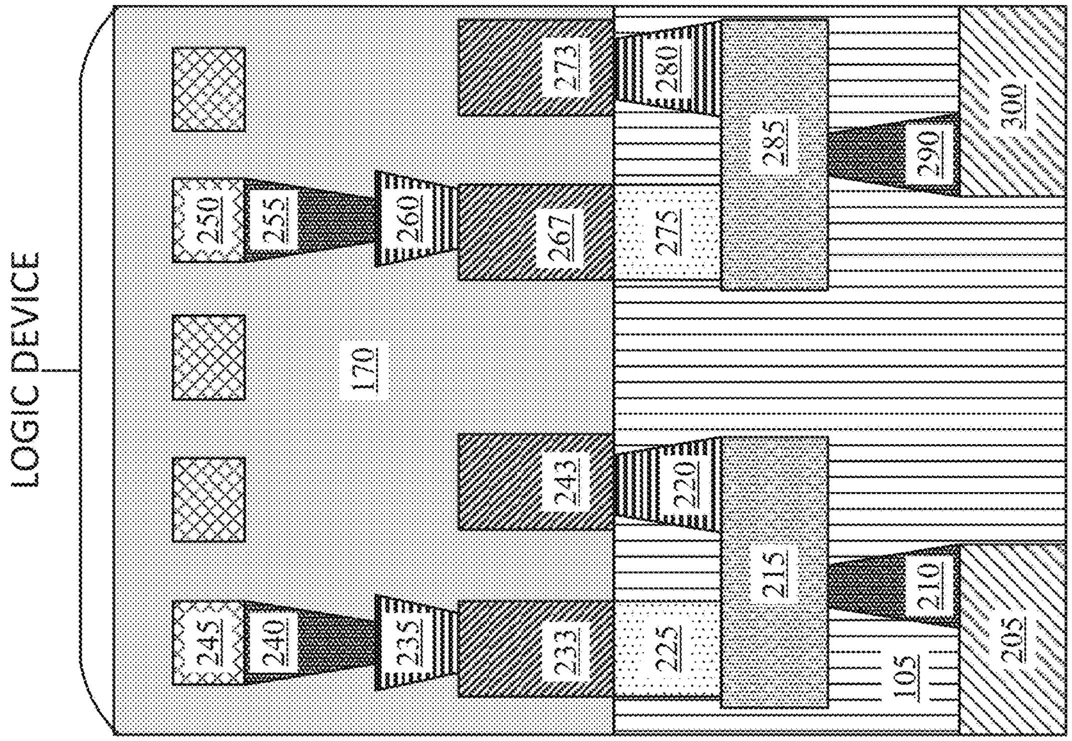
Figure 5C:
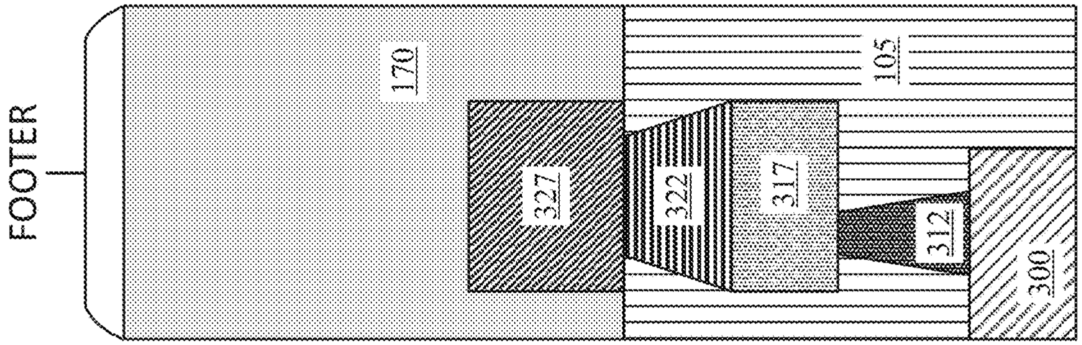

FIGS. 5A to 5C illustrates a cross section of across the second source/drain region, where the cross section extends through the header gate transistor, the logic device, and the footer gate transistor. FIG. 5A illustrates the header that includes the second source/drain 165, the second backside contact 190, the second backside power rail 195, a second backside via 197, and the first backside connecting power line 205. The first backside connecting power line 205 is connected to the header and the logic device. Therefore, the power/ground must pass through the header gate transistor prior connecting to the logic device. The use of the header gate transistor prevents leakage at the logic device because the header acts as a gate/switch for the power/ground connection to the logic device.

FIG. 5C illustrates the footer that includes a second footer source/drain 327, a second footer backside contact 322, a second footer backside power rail 317, a second footer backside via 312, and the second backside connecting power line 300. The second backside connecting power line 300 is connected to the footer and the logic device. Therefore, the power/ground must pass through the footer gate transistor prior connecting to the logic device. The use of the footer gate transistor prevents leakage at the logic device because the footer acts as a gate/switch for the power/ground connection to the logic device.

FIG. 5B illustrates the logic device that includes the first backside connecting power line 205, a first logic connecting via 210, a first logic backside power rail 215, a first logic backside contact 220, a first placeholder 225, a fifth logic source/drain 233, and a sixth logic source/drain 243. The logic device further includes a first frontside source/drain contact 235, a first frontside via 240, a first logic frontside metal line 245. The logic device includes a second frontside metal line 250, a second frontside source/drain contact 260, a second frontside via 255, a seventh logic source/drain 267, and a eighth logic source/drain 273. Additional backside components include a second placeholder 275, a second logic backside contact 280, a second logic backside power rail 285, a second logic connecting via 290, and a second backside power line 300.

Figure 6:
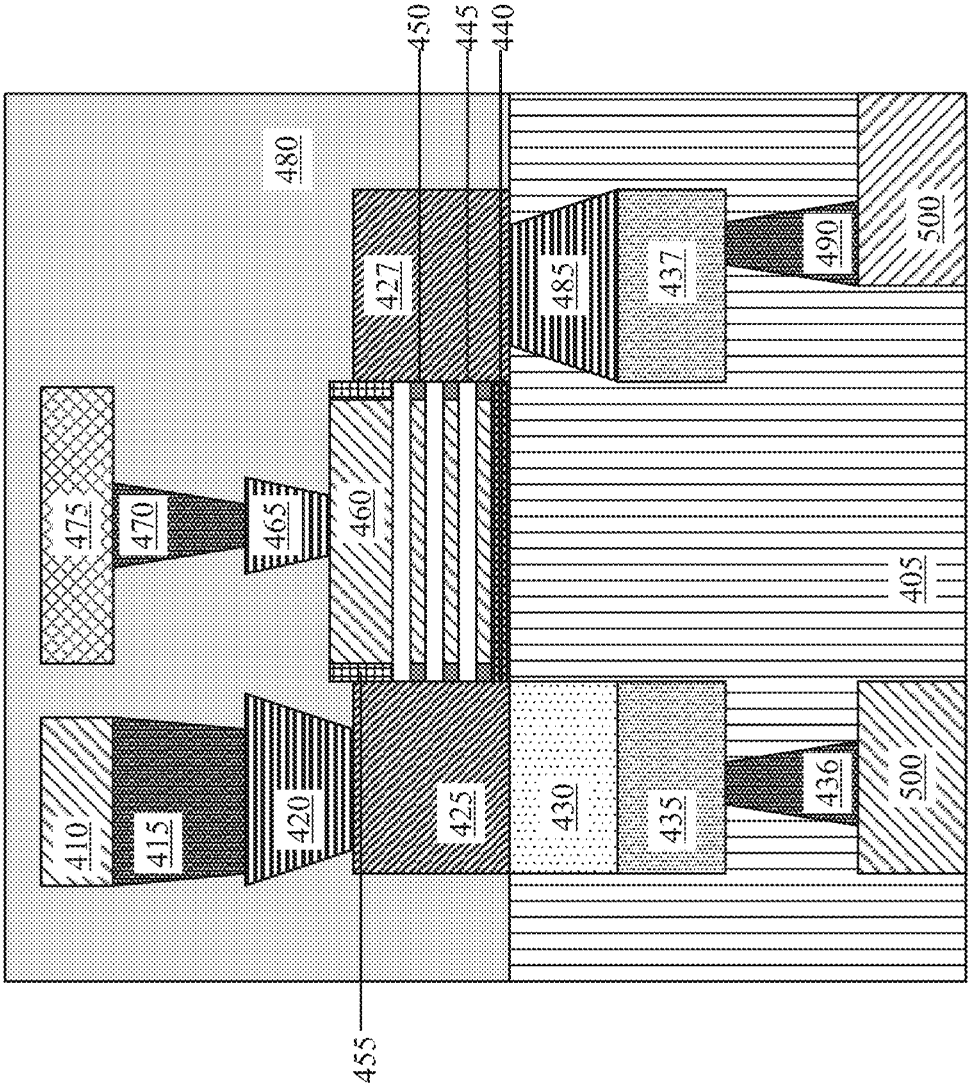
FIG. 6 illustrates a cross section X of header gate transistor, in accordance with the embodiment of the present invention.

FIG. 6 illustrates a cross section through the header gate transistor. The header gate transistor includes a backside interlayer dielectric layer 405 that is located around the backside components and a frontside interlayer dielectric layer 480 located around the frontside components. The frontside components includes a first source/drain 425, a second source/drain 427, a gate and channel region, a header gate contact 465, a second frontside via 470, and a frontside metal line 475. The frontside further includes a frontside source/drain contact 420, a first frontside via 415, a frontside power line 410. FIG. 6 differs from FIG. 2 where the outside power line is located. In FIG. 2, the outside power line (i.e., a backside power line 110) is located on the backside of the header, while in FIG. 6, the outside power line (i.e., the frontside power line 410) is located on the frontside of the header.

The backside components include a header backside placeholder 430, a first backside via 436, a first backside power rail 435, a first backside contact 485, a second backside power rail 437, a second backside via 490, and a first backside connecting power line 500. FIG. 6 illustrates that the first backside connecting power line 500 is connected to the first backside power rail 435, while the header backside placeholder 430 prevents the first backside power rail 435 from connecting to the first source/drain 425.

The gate and channel region includes a bottom dielectric layer 440, a plurality of channel layers 445, an inner spacer 450, an upper spacer 455, and a gate 460. The gate 460 can be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W. The gate header gate contact 465 is in contact with a top surface of the gate 460. The frontside metal line 475 is connected to the header gate contact 465 by the second frontside via 470. The first source/drain 425 is located adjacent to a first side of the gate region and the second source/drain 427 is located adjacent to a second side of the gate region, where the first side and the second side are opposite to each other. The first source/drain 425 and the second source/drain 427 are located flush against the side of the channel layers 445 and the inner spacer 450.

The first source/drain 425 and the second source/drain 427 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figures 7A, 7B, 7C:
FIGS. 7A to 7C illustrate cross section Y1 of a first source/drain region across the header gate transistor, the logic device, and the foot gate transistor, in accordance with the embodiment of the present invention.

FIGS. 7A to 73C illustrates a cross section of across the first source/drain region, where the cross section extends through the header gate transistor, the logic device, and the footer gate transistor. FIG. 7A shows a cross section across the header gate transistor (hereinafter, header). FIG. 7B shows the cross section across the logic device, and FIG. 7C shows the cross section across the footer gate transistor (hereinafter, footer).

As FIGS. 7A to 7C the frontside interlayer dielectric layer 480 and the backside interlayer dielectric layer 405 are located in the header, the logic device, and the footer. A first backside via 436 connects the first backside connecting power line 500 to a backside surface of the first backside power rail 435. The frontside surface of the first backside power rail 435 is in contact with a backside surface of the header backside placeholder 430. The header backside placeholder 430 is located between the first source/drain 425 and the first backside power rail 435, thus the header backside place holder 430 prevents an electrical connection between these two components.

The first source/drain 425 is connected to the frontside power line 410 by the first frontside via 415 and the frontside source/drain contact 420. The outside power/ground is connected to the header via the frontside power line 410, for example, where the frontside power line 410 can be either a VSS or VDD source. The power/ground is directly connected to the header, so that the header acts as an intermediary power component between the outside power/ground and the logic device.

The footer illustrated in FIG. 7C has a similar structure as the header illustrated in FIG. 7A. The footer includes a second backside power line 600 (also referred to as the second backside power connecting line), a third backside via 642, a first footer backside power rail 640, and a footer backside placeholder 630. The frontside of the footer includes a footer frontside power line 610, a first footer frontside via 615, a frontside source/drain contact 620, and a first footer source/drain 625. The footer backside placeholder 630 is located between the first footer source/drain 625 and the first footer backside power rail 640, thus the header backside placeholder 630 prevents an electrical connection between these two components. The first footer source/drain 625 is connected to the footer frontside power line 610 by the first footer frontside via 615 and the frontside source/drain contact 620. The outside power/ground is connected to the footer via the footer frontside power line 610, for example, where the footer frontside power line 610 can be either a VSS or VDD source. The power/ground is directly connected to the footer, so that the footer acts as an intermediary power component between the outside power/ground and the logic device.

FIG. 7B illustrates a cross section of the logic device through the first source/drain region. The logic device includes the first backside connecting power line 500, a first logic connecting via 510, a first logic backside power rail 515, a first logic backside contact 520, a first placeholder 525, a first logic source/drain 530, and a second logic source/drain 542. The logic device further includes a first frontside source/drain contact 535, a first frontside via 540, a first logic frontside metal line 545. The logic device includes a second frontside metal line 550, a second frontside source/drain contact 560, a second frontside via 555, a third logic source/drain 565, and a fourth logic source/drain 570. Additional backside components include a second placeholder 575, a second logic backside contact 580, a second logic backside power rail 585, a second logic connecting via 590, and a second backside power line 600. The first backside power line 500 is connected to the header and the second backside power line 600 is connected to the footer.

The first footer source/drain 625, the first logic source/drain 530, the second logic source/drain 542, the third logic source/drain 565, and the fourth logic source/drain 570 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figures 8A, 8B, 8C:
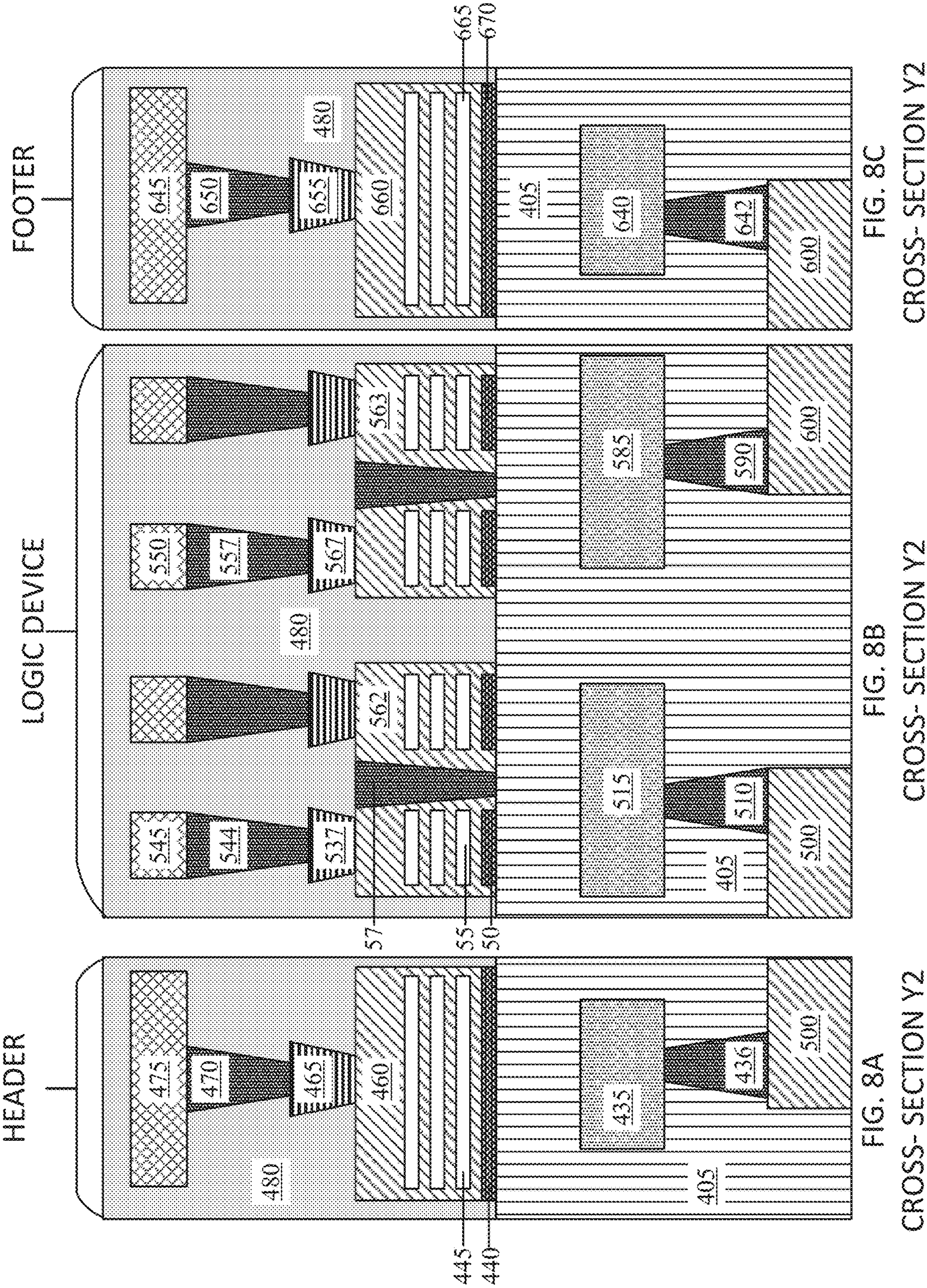
FIGS. 8A to 8C illustrate cross section Y2 of a gate region across the header gate transistor, the logic device, and the foot gate transistor, in accordance with the embodiment of the present invention.

FIGS. 8A to 8C illustrates a cross section of across the gate region, where the cross section extends through the header gate transistor, the logic device, and the footer gate transistor. As illustrated by FIG. 8A, the gate region of the header includes the bottom dielectric layer 440, the channel layers 445, the gate 460, the header gate contact 465, the frontside via 470, and the frontside metal line 475. FIG. 8C illustrates the footer, where the footer includes a footer bottom dielectric isolation layer 670, the footer channel layers 665, the footer gate 660, the footer gate contact 655, the footer frontside via 650, and the frontside footer metal line 645.

FIG. 8B illustrates the logic device that where the backside of the logic device includes the first backside power connecting line 500, the first logic connecting via 510, the first logic backside power rail 515, the second logic backside power rail 585, the second logic connecting via 590, and the second backside power line 600. The frontside of the logic device includes a logic bottom dielectric layer 50, a plurality of logic channel layers 55, a first logic gate 562, a logic gate cut 57, a first logic gate contact 537, a first logic gate via 544 the first logic frontside metal line 545, a second logic frontside metal line 550, a second logic gate via 557, a second logic gate contact 567, and a second logic gate 563. The first logic gate 562, the second logic gate 563, the header gate 460 and the footer gate 660 be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W.

Figures 9A, 9B, 9C:
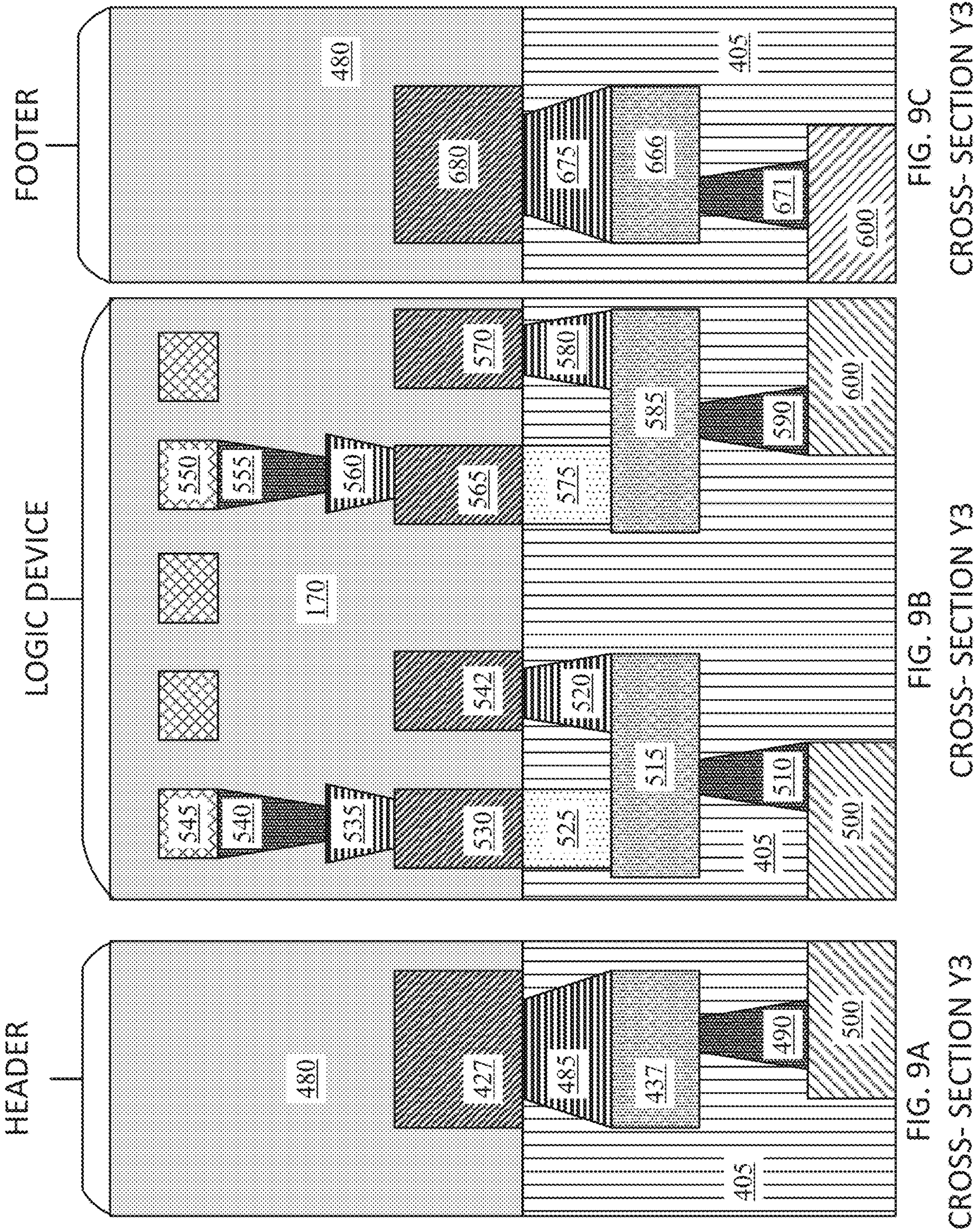
FIGS. 9A to 9C illustrate cross section Y3 of a second source/drain region across the header gate transistor, the logic device, and the foot gate transistor, in accordance with the embodiment of the present invention.

FIGS. 9A to 9C illustrates a cross section of across the second source/drain region, where the cross section extends through the header gate transistor, the logic device, and the footer gate transistor. FIG. 9A illustrates the header that includes the second source/drain 427, the second backside contact 485, the second backside power rail 437, a second backside via 490, and the first backside connecting power line 500. The first backside connecting power line 500 is connected to the header and the logic device. Therefore, the power/ground must pass through the header gate transistor prior connecting to the logic device. The use of the header gate transistor prevents leakage at the logic device because the header acts as a gate/switch for the power/ground connection to the logic device.

FIG. 9C illustrates the footer that includes a second footer source/drain 680, a second footer backside contact 675, a second footer backside power rail 666, a second footer backside via 671, and the second backside connecting power line 600. The second backside connecting power line 300 is connected to the footer and the logic device. Therefore, the power/ground must pass through the footer gate transistor prior connecting to the logic device. The use of the footer gate transistor prevents leakage at the logic device because the footer acts as a gate/switch for the power/ground connection to the logic device.

FIG. 9B illustrates the logic device that includes the first backside connecting power line 500, a first logic connecting via 510, a first logic backside power rail 515, a first logic backside contact 520, a first placeholder 525, a fifth logic source/drain 530, and a sixth logic source/drain 542. The logic device further includes a first frontside source/drain contact 535, a first frontside via 540, a first logic frontside metal line 545. The logic device includes a second frontside metal line 550, a second frontside source/drain contact 560, a second frontside via 555, a seventh logic source/drain 565, and a eighth logic source/drain 570. Additional backside components include a second placeholder 575, a second logic backside contact 580, a second logic backside power rail 585, a second logic connecting via 590, and a second backside power line 600.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic architecture comprising:

a logic device;

a header gate transistor located adjacent to a first side of the logic device, wherein the header gate transistor has a parallel orientation to the logic device, wherein the header gate transistor is connected to a VSS source or a VDD source; and a footer gate transistor located adjacent to a second side of the logic device, wherein the footer gate transistor has a parallel orientation to the logic device, wherein the first side and the second side are opposite sides of the logic device, wherein the footer gate transistor is connected to a VSS source or a VDD source, wherein the footer gate transistor is connected to a different source than the header gate transistor, wherein the logic device is connected to the VSS source and the VDD source through either of the footer gate transistor and the header gate transistor, wherein the header gate transistor, the footer gate transistor, and the logic device are located on the same level on top of a backside interlayer dielectric layer.

2. The microelectronic architecture of claim 1, further comprises:

a first backside power line connected to a component of the header gate transistor, wherein the first backside power line is connected to the VSS source or the VDD source; and a first backside power connecting line that connects the header gate transistor to the logic device.

3. The microelectronic architecture of claim 2, wherein the first backside power line and the first backside power connecting line are located on a backside of the header gate transistor.

4. The microelectronic architecture of claim 3, wherein the first backside power line is located at a first level, wherein the first backside power connecting line is located at a second level, and wherein the first level and the second level are different.

5. The microelectronic architecture of claim 2, further comprises:

a second backside power line connected to a component of the footer gate transistor, wherein the second backside power line is connected to the VSS source or the VDD source; and a second backside power connecting line that connects the footer gate transistor to the logic device.

6. The microelectronic architecture of claim 5, wherein the second backside power line and the second backside power connecting line are located on the backside of the footer gate transistor.

7. The microelectronic architecture of claim 6, wherein the second backside power line is located at a first level, wherein the second backside power connecting line is located at a second level, and wherein the first level and the second level are different.

8. The microelectronic architecture of claim 5, wherein the header gate transistor further comprises:

a first header source/drain epi and a second header source/drain epi;

wherein the first backside power line is connected to a backside surface of the first header source/drain epi, wherein the first backside power connecting line is connected to a backside surface of the second header source/drain epi.

9. The microelectronic architecture of claim 8, wherein the footer gate transistor further comprises:

a first footer source/drain epi and a second footer source/drain epi;

wherein the second backside power line is connected to a backside surface of the first footer source/drain epi, wherein the second backside power connecting line is connected to a backside surface of the second footer source/drain epi.

10. The microelectronic architecture or claim 8, wherein the logic device further comprises:

a first logic source/drain epi and a second logic source/drain epi;

wherein the first backside power connecting line is connected to a backside surface of the first logic source/drain epi, and wherein the second backside power connecting line is connected to a backside surface of the second logic source/drain epi.

11. A microelectronic architecture comprising:

a logic device;

a header gate transistor located adjacent to a first side of the logic device, wherein the header gate transistor has a parallel orientation to the logic device, wherein the header gate transistor is connected to a VSS source or a VDD source, wherein the VSS source or the VDD source is connected to the frontside of the header gate transistor; and a footer gate transistor located adjacent to a second side of the logic device, wherein the footer gate transistor has parallel orientation to the logic device, wherein the first side and the second side are opposite sides of the logic device, wherein the footer gate transistor is connected to a VSS source or a VDD source, wherein the footer gate transistor is connected to a different source than the header gate transistor, wherein the logic device is connected to the VSS source and the VDD source through either footer gate transistor and the header gate transistor, wherein the VSS source or the VDD source is connected to the frontside of the footer gate transistor, wherein the header gate transistor, the footer gate transistor, and the logic device are located on the same level on top of a backside interlayer dielectric layer.

12. The microelectronic architecture of claim 11, further comprises:

a first frontside power line connected to a component of the header gate transistor, wherein the first frontside power line is connected to the VSS source or the VDD source; and a first backside power connecting line that connects the header gate transistor to the logic device.

13. The microelectronic architecture of claim 12, wherein the first frontside power line is located on the frontside of the header gate transistor and the first backside power connecting line is located on the backside of the header gate transistor.

14. The microelectronic architecture of claim 11, further comprises:

a second frontside power line connected to a component of the footer gate transistor, wherein the second frontside power line is connected to the VSS source or the VDD source; and a second backside power connecting line that connects the footer gate transistor to the logic device.

15. The microelectronic architecture of claim 14, wherein the second frontside power line is located on the frontside of the footer gate transistor and the second backside power connecting line is located on the backside of the footer gate transistor.

16. The microelectronic architecture of claim 14, further comprises:

a first header source/drain epi and a second header source/drain epi;

wherein the first frontside power line is connected to a frontside surface of the first header source/drain epi, wherein the first backside power connecting line is connected to a backside surface of the second header source/drain epi.

17. The microelectronic architecture of claim 16, wherein the footer gate transistor further comprises:

a first footer source/drain epi and a second footer source/drain epi;

wherein the second frontside power line is connected to a frontside surface of the first footer source/drain epi, wherein the second backside power connecting line is connected to a backside surface of the second footer source/drain epi.

18. The microelectronic architecture or claim 17, wherein the logic device further comprises:

a first logic source/drain epi and a second logic source/drain epi;

wherein the first backside power connecting line is connected to a backside surface of the first logic source/drain epi, and wherein the second backside power connecting line is connected to a backside surface of the second logic source/drain epi.

19. A microelectronic architecture comprising:

a logic device;

a header gate transistor and a footer gate transistor are located on different sides of the logic device, respectively, wherein the backside of the header gate transistor and the backside of the footer gate transistor is each connected to either a VSS source or a VDD source, wherein the backside of the logic device is connected to the VSS source and the VDD source through either of the footer gate transistor and the header gate transistor, wherein the header gate transistor, the footer gate transistor, and the logic device are located on the same level on top of a backside interlayer dielectric layer.

20. The microelectronic architecture of claim 19, further comprising:

wherein the header gate transistor further comprises:

a first backside power line connected to the header gate transistor, wherein the first backside power line is connected to the VSS source or the VDD source; and a first backside power connecting line that connects the header gate transistor to the logic device;

wherein the footer gate transistor further comprises:

a first footer source/drain epi and a second footer source/drain epi;

wherein the second backside power line is connected a backside surface of the first footer source/drain epi, wherein the second backside power connecting line is connected to a backside surface of the second footer source/drain epi;

wherein the second backside power line is located at a first level, wherein the second backside power connecting line is located at a second level, and wherein the first level and the second level are different.

* * * * *